United States Patent
Ozturk et al.

(10) Patent No.: US 7,211,458 B2
(45) Date of Patent: May 1, 2007

(54) METHODS OF FABRICATING STRAINED SEMICONDUCTOR-ON-INSULATOR FIELD-EFFECT TRANSISTORS AND RELATED DEVICES

(75) Inventors: Mehmet Ozturk, Cary, NC (US); Veena Misra, Raleigh, NC (US); Saurabh Chopra, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 0 days.

(21) Appl. No.: 11/199,313

(22) Filed: Aug. 8, 2005

(65) Prior Publication Data
US 2007/0029553 A1    Feb. 8, 2007

(51) Int. Cl.
*H01L 21/00* (2006.01)
*H01L 29/04* (2006.01)
*H01L 27/148* (2006.01)

(52) U.S. Cl. .......................... 438/36; 438/37; 438/46; 438/87; 257/63; 257/219; 257/223

(58) Field of Classification Search .............. 438/36, 438/37, 46, 87, 93; 257/63, 65, 219, 223, 257/229, 609
See application file for complete search history.

(56) References Cited

U.S. PATENT DOCUMENTS 6,815,278 B1 * 11/2004 Ieong et al. ................ 438/198

OTHER PUBLICATIONS

Ghani et al. "A 90nm High Volume Manufacturing Logic Technology Featuring Novel 45nm Gate Length Strained Silicon CMOS Transistors", *IEDM* (2003).
Rim et al. "Fabrication and Mobility Characteristics of Ultra-thin Strained Si Directly on Insulator (SSDOI) MOSFETs", *IEDM* 3:49-52 (2003).
STMicroelectronics, *Silicon on Nothing*, Challenge 1st Edition 2002.

* cited by examiner

*Primary Examiner*—Hsien-Ming Lee
(74) *Attorney, Agent, or Firm*—Myers Bigel Sibley & Sajovec, P.A.

(57) ABSTRACT

A method of fabricating a semiconductor device includes forming a strained first semiconductor layer on an insulating layer that is between second semiconductor layers. The strained first semiconductor layer may be epitaxially grown from the second semiconductor layers to extend onto the insulating layer between the second semiconductor layers. The second semiconductor layers have a lattice constant that is different than that of the first semiconductor layer, such that strain may be created in the first semiconductor layer. Related devices are also discussed.

39 Claims, 9 Drawing Sheets

METHODS OF FABRICATING STRAINED SEMICONDUCTOR-ON-INSULATOR FIELD-EFFECT TRANSISTORS AND RELATED DEVICES

FIELD OF THE INVENTION

The present invention relates to semiconductor devices, and more particularly, to methods of fabricating field-effect transistors (FET) and related devices.

BACKGROUND OF THE INVENTION

Developments in silicon-based integrated circuit technology, including field-effect transistor (FET) technology, have provided greater device speed, increased integration density, and/or improved functionality. However, as transistor dimensions continue to scale-down, a variety of operational and structural problems may arise. For example, as the channel length of a transistor is reduced, short-channel effects such as punch-through, drain induced barrier lowering (DIBL), and increased leakage current may occur.

As such, alternative transistor designs are being developed to address problems associated with shrinking device dimensions while improving transistor performance. One alternative design involves the use of strained silicon in the channel region of the transistor. Strain may be created in crystalline silicon by applying layers of other materials to physically elongate or compress bonds between the crystal's atoms. For example, germanium atoms may replace some of the silicon atoms near a surface of a silicon wafer, and a thin layer of silicon may be grown on top of this silicon-germanium (SiGe) layer. Because germanium atoms are larger than silicon atoms, the distance between the atoms in the silicon-germanium lattice is greater than it is in pure silicon. As such, when a silicon layer is grown on top of a silicon germanium layer, the silicon atoms may line-up with the silicon-germanium lattice below, which may increase the distance between silicon atoms and thereby create strain in the silicon layer. This strain may enable electrical charges to pass more easily through the silicon lattice. Thus, carrier mobility may be increased in a transistor having a strained silicon channel region.

A particular application employing strained silicon, developed by Intel Corporation, is described by T. Ghani et al. in "A 90 nm High Volume Manufacturing Logic Technology Featuring Novel 45 nm Gate Length Strained Silicon CMOS Transistors" (IEDM 2003). As stated in Ghani et al., a PMOS transistor structure features an epitaxially grown strained silicon-germanium (SiGe) film embedded in the source/drain regions of a transistor by using a selective epitaxial growth process. A combination of compressive SiGe strain and embedded SiGe source/drain geometry induces a large uniaxial compressive strain in the channel region of the transistor.

Another application employing strained silicon, developed by IBM, is discussed by K. Rim et al. in "Fabrication and Mobility Characteristics of Ultra-thin Strained Si Directly on Insulator (SSDOI) MOSFETs" (IEDM 2003). As stated in Rim et al., a strained silicon (Si) directly-on-insulator structure is fabricated by a layer transfer technique. A thin layer of strained Si is epitaxially grown on a relaxed silicon germanium (SiGe) graded buffer. An insulator layer, which is to become the buried oxide layer, is formed on top of the strained Si layer by a combination of thermal oxidation and CVD oxide deposition. After planarizing the oxide surface with a chemical mechanical polishing step, hydrogen is implanted through the oxide and into the SiGe layer, and the wafer is bonded to a silicon wafer ("handle substrate"). Thermal annealing induces cavity formation within the SiGe buffer by the implanted hydrogen, and the bonded stack is split at the interface created by these cavities, leaving the buried oxide layer, the strained Si layer, and a layer of relaxed SiGe on the new handle wafer. After a thermal anneal step to strengthen the bonding interface, the SiGe layer on top of the strained Si layer is selectively removed, leaving only the strained Si layer on the buried oxide.

SUMMARY OF THE INVENTION

According to some embodiments of the present invention, a method of fabricating a semiconductor device includes forming a strained first semiconductor layer on an insulating layer that is between second semiconductor layers having a lattice constant different than that of the first semiconductor layer. For example, the second semiconductor layers may have a lattice constant that is greater than that of the first semiconductor layer. In some embodiments, the second semiconductor layers and the insulating layer therebetween may be formed on a substrate, and the strained first semiconductor layer may be epitaxially grown from the second semiconductor layers to extend onto the insulating layer between the second semiconductor layers.

In some embodiments, the second semiconductor layers may be selectively and epitaxially grown adjacent the insulating layer on opposite sides thereof. The second semiconductor layers may extend away from the substrate beyond the insulating layer.

In other embodiments, the strained first semiconductor layer may be epitaxially grown from sidewalls of the second semiconductor layers to extend onto the insulating layer.

In some embodiments, epitaxially growing the strained first semiconductor layer may include forming an amorphous semiconductor layer on the insulating layer and the second semiconductor layers, and then crystallizing the amorphous semiconductor layer. For example, the amorphous semiconductor layer may be laterally crystallized from the second semiconductor layers onto the insulating layer until crystal growth fronts thereof coalesce on the insulating layer. The amorphous semiconductor layer may be crystallized by annealing the amorphous semiconductor layer at a temperature of about 500° C. The amorphous semiconductor layer may be deposited on the insulating layer and the second semiconductor layers using, for example, ultra-high vacuum rapid thermal chemical vapor deposition (UHV-RTCVD), remote plasma chemical vapor deposition (RPCVD), and/or other chemical vapor deposition techniques at a temperature low enough to avoid nucleation on the insulating layer.

In other embodiments, the insulating layer may be an oxide layer, and the second semiconductor layers may be silicon-germanium layers. The second semiconductor layers may further include boron and/or carbon to at least partially compensate the strain and/or adjust the atomic spacing of the silicon-germanium layer. The first semiconductor layer may be a strained silicon and/or germanium layer. The first semiconductor layer may be under uniaxial compressive strain when a distance between the second semiconductor layers may be less than about 100 nm.

In some embodiments, the insulating layer may be an oxide layer, and the second semiconductor layers may be silicon layers. The first semiconductor layer may be a silicon-germanium layer under uniaxial tensile strain.

In other embodiments, the method may include removing at least a portion of the insulating layer adjacent the strained first semiconductor layer to form a semiconductor-on-nothing device. For example, the insulating layer may be removed by selectively etching the substrate to remove at least a portion of the insulating layer.

In some embodiments, at least a portion the strained first semiconductor layer may be a channel region of a field-effect transistor device. Transistor source/drain regions may be formed in the first and/or second semiconductor layers, for example, by ion implantation and/or dopant out-diffusion. Source/drain contacts may then be formed electrically contacting the source/drain regions. For example, the source/drain contacts may be formed of nickel germanosilicide. Alternatively, the source/drain contacts may be formed of another germanosilicide having sufficient thermal stability during subsequent process steps.

According to further embodiments of the present invention, a method of forming a semiconductor device includes forming on a substrate an oxide layer and silicon-germanium layers at opposite sides of the oxide layer, and epitaxially growing a strained silicon layer from the silicon-germanium layers to extend onto the oxide layer between the silicon germanium layers.

In some embodiments, epitaxially growing the strained silicon layer may include forming an amorphous silicon layer on the insulating layer and the silicon germanium layers, and then crystallizing the amorphous silicon layer. For example, the amorphous silicon layer may be laterally crystallized from the silicon germanium layers onto the oxide layer until crystal growth fronts thereof coalesce on the oxide layer. The amorphous silicon layer may be crystallized by annealing the amorphous silicon layer at a temperature of about 500° C. The amorphous silicon layer may be deposited on the insulating layer and the second semiconductor layers using ultra-high vacuum rapid thermal chemical vapor deposition (UHV-RTCVD) and/or remote plasma chemical vapor deposition (RPCVD) at a temperature low enough to avoid nucleation on the oxide layer.

In some embodiments, the strained silicon layer may be epitaxially grown from sidewalls of the silicon germanium layers to extend onto the oxide layer.

In other embodiments, the silicon-germanium layers may be selectively epitaxially grown on opposite sides of the oxide layer. The silicon germanium layers may further include boron and/or carbon to at least partially compensate the strain and/or adjust the atomic spacing of the silicon-germanium layer. A distance between the silicon germanium layers may be less than about 100 nm, and the strained silicon layer may be under uniaxial compressive strain.

In some embodiments, at least a portion of the oxide layer adjacent the strained silicon layer may be removed to form a silicon-on-nothing device.

According to some embodiments of the present invention, a semiconductor device, may include a substrate, an insulating layer on the substrate, second semiconductor layers on the substrate adjacent the insulating layer at opposite sides thereof, and a strained first semiconductor layer. The strained first semiconductor layer extends from the second semiconductor layers onto the insulating layer and has a lattice constant that is different than that of the second semiconductor layers.

In some embodiments, the strained first semiconductor layer may be a strained semiconductor epitaxial layer that extends from the second semiconductor layers onto the insulating layer. The strained semiconductor epitaxial layer may have a lattice constant that is less than that of the second semiconductor layers. In some embodiments, the strained semiconductor epitaxial layer may extend from sidewalls of the second semiconductor layers onto the insulating layer.

In other embodiments, the second semiconductor layers may be second semiconductor epitaxial layers on opposite sides of the insulating layer. The second semiconductor layers may extend away from the substrate beyond the insulating layer.

In some embodiments, the insulating layer may be an oxide layer, the second semiconductor layers may be silicon germanium layers, and the first semiconductor layer may be strained silicon and/or germanium layers. The second semiconductor layers may further include boron and/or carbon to at least partially compensate the strain and adjust the atomic spacing of the silicon-germanium layer. The first semiconductor layer may be under uniaxial compressive strain when a distance between the second semiconductor layers is less than about 100 nm.

In other embodiments, the insulating layer may be an oxide layer, the second semiconductor layers may be silicon layers, and the strained first semiconductor layer may be a silicon-germanium layer under uniaxial tensile strain.

In some embodiments, at least a portion of the strained first semiconductor layer may be a channel region of a field-effect transistor device. The device may further include source/drain regions in the first and/or second semiconductor layers, and source/drain contacts electrically contacting the source/drain regions. The source/drain contacts may be nickel germanosilicide contacts.

DETAILED DESCRIPTION OF EMBODIMENTS OF THE INVENTION

Figure 1:
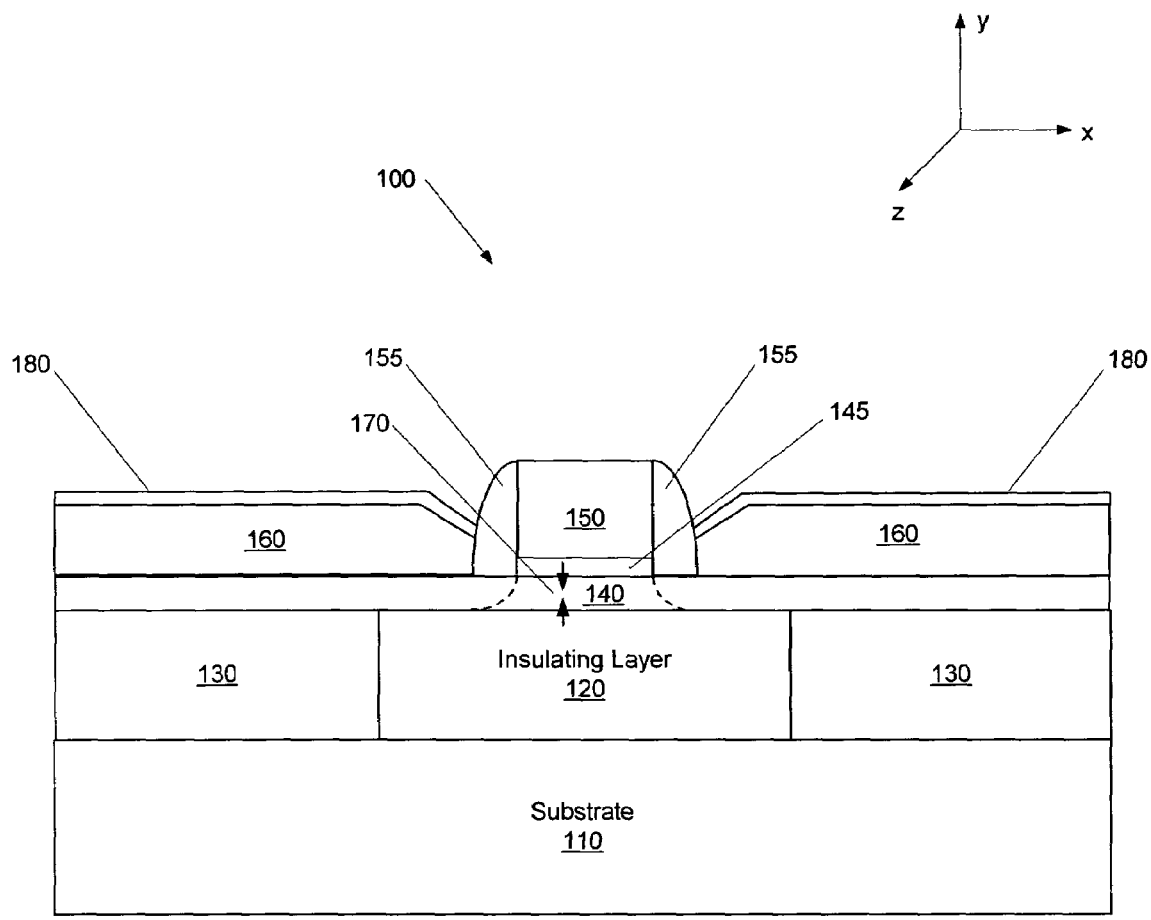
FIG. 1 is a cross-sectional view illustrating strained semiconductor-on-insulator devices according to some embodiments of the present invention.

The present invention will be described more fully hereinafter with reference to the accompanying drawings, in which exemplary embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. All publications, patent applications, patents, and other references mentioned herein are incorporated by reference in their entirety.

FIG. 1 is a cross-sectional view illustrating a strained semiconductor-on-insulator device according to some embodiments of the present invention. Referring now to FIG. 1, a semiconductor-on-insulator device 100 includes a substrate 110, an insulating layer 120 on the substrate 110, second semiconductor layers 130 on the substrate 110 at opposite sides of the insulating layer 120, and a strained first semiconductor layer 140. The device 100 may also include a gate insulating layer 145, a gate electrode 150, spacers 155, and raised source/drain regions 160.

The strained first semiconductor layer 140 extends from the second semiconductor layers 130 onto the insulating layer 120. In some embodiments, the strained first semiconductor layer 140 may be a strained semiconductor epitaxial layer that is grown from the second semiconductor layers 130 to extend directly onto the insulating layer 120. For example, the strained first semiconductor layer 140 may be grown from the second semiconductor layers 130 using a solid-phase epitaxy (SPE) process.

The second semiconductor layers 130 may also be semiconductor epitaxial layers. For example, the second semiconductor layers 130 may be selectively grown on the substrate 110 at opposite sides of the insulating layer 120 using a selective epitaxial growth (SEG) process. Also, the second semiconductor layers 130 may be strained layers. In some embodiments, the second semiconductor layers 130 may extend away from the substrate 110 beyond the insulating layer 120. For example, the second semiconductor layers 130 may be formed thicker than the insulating layer 120 such that the second semiconductor layers 130 extend to a height greater than the insulating layer 120. Alternatively, the insulating layer 120 may be recessed so that the second semiconductor layers 130 extend beyond the insulating layer 120. In some embodiments, the substrate 110 may be one or more conductive and/or insulating layers on a base substrate.

The strained semiconductor layer 140 has a lattice constant that is different than that of the second semiconductor layers 130. In some embodiments, the strained first semiconductor layer 140 may have an original, unstrained lattice constant that is less than that of the second semiconductor layers 130. For example, the strained first semiconductor layer 140 may be formed of silicon, while the second semiconductor layers 130 may be formed of silicon-germanium. As such, portions of the strained first semiconductor layer 140 along a surface of the second semiconductor layers 130 may be under biaxial tensile strain, which may be suitable for achieving high channel mobility in n-channel MOSFETS. More specifically, portions of the strained first semiconductor layer 140 may be under biaxial tensile strain along the x- and z-directions of FIG. 1. Moreover, portions of the strained first semiconductor layer 140 on the insulating layer 120 may be under uniaxial compressive strain along the y-direction, indicated by arrows 170. Alternatively, the strained first semiconductor layer 140 may have an original, unstrained lattice constant that is greater than that of the second semiconductor layers 130. For example, the second semiconductor layers 130 may be silicon, and the strained first semiconductor layer 140 may be silicon-germanium. In such a configuration, portions of the strained first semiconductor layer 140 on the insulating layer 120 may be under uniaxial tensile strain along the y-direction and biaxial compressive strain along x- and z-directions.

Still referring to FIG. 1, at least a portion of the strained first semiconductor layer 140 may form a channel region of a field-effect transistor, such as a MOSFET. As such, source/drain regions may be formed in portions of the first 140 and/or second 130 semiconductor layers, for example, as shown by the dashed lines in FIG. 1. The source/drain regions may be formed by an ion implantation process, using the gate 150 and the spacers 155 as an implantation mask. The source/drain regions may have a junction depth equal to the thickness of the insulating layer 120. Also, source/drain contacts may be formed on a surface of the source/drain regions. For example, the source/drain contacts may be nickel germanosilicide contacts.

Alternatively, raised source/drain regions 160 may be formed on the strained first semiconductor layer 140, as shown in FIG. 1. For example, the raised source/drain regions 160 may be raised silicon-germanium source/drain regions formed by a second selective epitaxial growth (SEG) process using in-situ doping. Optionally, an ion implantation process may also be used. Also, the raised source/drain regions 160 may be used as a source for dopant out-diffusion to dope the regions of the first semiconductor layer 140 between the regions 130 and 160. Moreover, source/drain contacts 180 may be formed on surfaces of the raised source/drain regions 160, such as on top surfaces and/or sidewalls of the raised source/drain regions 160. As such, the additional thickness provided by the raised source/drain regions 160 may allow for reduced contact resistance by reducing and/or eliminating the possibility of consuming the strained first semiconductor layer 140 during contact formation and/or by limiting the contact area to the cross-sectional area of the strained first semiconductor layer 140. Additionally, where the raised source/drain regions 160 are formed of silicon-germanium, the raised source/drain regions 160 may have a smaller bandgap than that of silicon. As contact resistance is an exponential function of the contact barrier height (which is a fraction of the bandgap), the raised source/drain regions 160 may provide a lower contact resistance.

Although FIG. 1 illustrates an exemplary strained semiconductor-on-insulator device 100, it should be noted that the present invention is not limited to such a configuration. As such, all of the features illustrated in FIG. 1 may not be included in some embodiments of the present invention. For example, although FIG. 1 is illustrated and described with reference to raised source/drain regions 160, it should be noted that such features may not be present in all embodiments of the present invention.

Figure 2A:
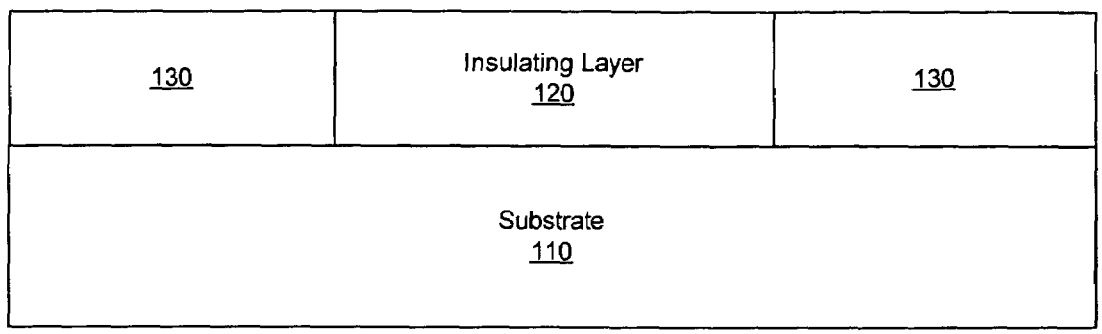
FIGS. 2A to 2E are cross-sectional views illustrating strained semiconductor-on-insulator devices according to exemplary embodiments of the present invention during intermediate fabrication steps according to exemplary embodiments of the present invention.

FIGS. 2A to 2E are cross-sectional views illustrating strained semiconductor-on-insulator devices, such as the strained semiconductor-on-insulator device 100 of FIG. 1, according to some embodiments of the present invention during intermediate fabrication steps according to exemplary embodiments of the present invention. Referring now to FIG. 2A, an insulating layer 120 and second semiconductor layers 130 are formed on a substrate 110. For example, the insulating layer 120 may first be formed on the substrate 110, and then the second semiconductor layers 130 may be selectively epitaxially grown on opposite sides of the insulating layer 120. Alternatively, the second semiconductor layers 130 may be formed on the substrate 110, and then the insulating layer 120 may be formed therebetween. As a further alternative, a second semiconductor layer may be blanket formed on the substrate 110, and then a middle portion thereof may be selectively etched away to form the second semiconductor layers 130. The insulating layer 120 may then be formed between the second semiconductor layers 130.

Figure 2B:
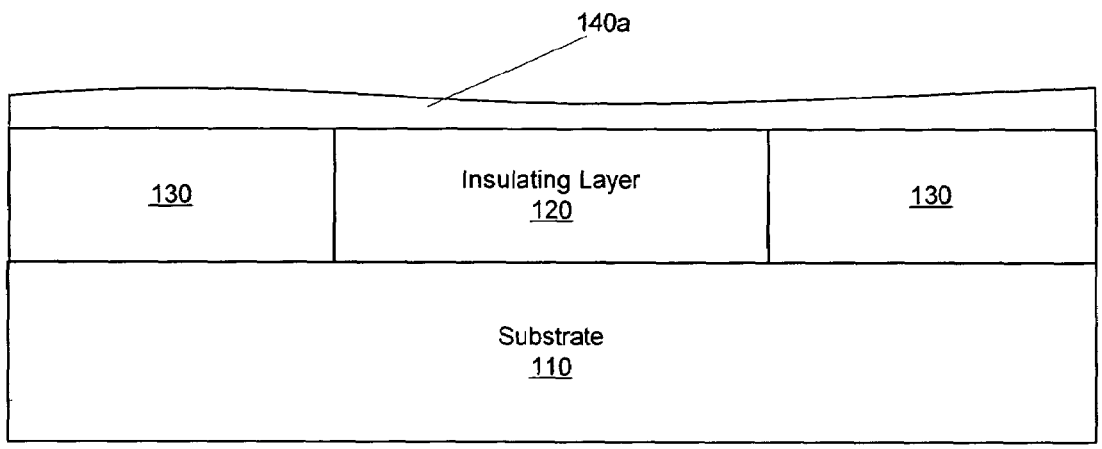
Figure 2C:
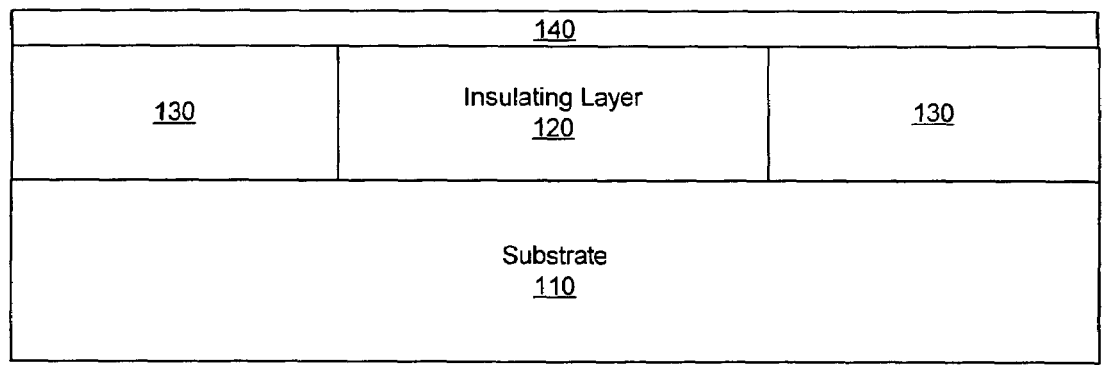

A strained first semiconductor layer 140 having a lattice constant different from that of the second semiconductor layers 130 is then formed on the insulating layer 120, as shown in FIGS. 2B and 2C. In some embodiments, the strained first semiconductor layer 140 may have a lattice constant that is less than that of the second semiconductor layers 130. The strained first semiconductor layer 140 may be epitaxially grown from the second semiconductor layers 130 to extend onto the insulating layer 120 between the second semiconductor layers 130. For example, the strained first semiconductor layer 140 may be grown using a solid-phase epitaxy (SPE) process.

More particularly, as illustrated in FIG. 2B, an amorphous semiconductor layer 140a is formed on the insulating layer 120 and the second semiconductor layers 130. For example, the amorphous semiconductor layer 140a may be deposited directly on the insulating layer 120 and the second semiconductor layers 130 using ultra-high vacuum rapid thermal chemical vapor deposition (UHV-RTCVD), remote plasma chemical vapor deposition (RPCVD), and/or any other technique which may be used to deposit amorphous silicon with relatively low contamination levels of oxygen and/or carbon. The amorphous semiconductor layer 140a may be deposited at a temperature low enough to avoid polycrystalline nucleation. The amorphous semiconductor layer 140a may be conformal with the topology of the underlying insulating layer 120 and second semiconductor layers 130. As such, if the second semiconductor layers 130 extend from the substrate 110 beyond the insulating layer 120, portions of the amorphous semiconductor layer 140a on the second semiconductor layers 130 may also extend beyond the insulating layer 120. Alternatively, if the insulating layer 120 extends from the substrate 110 beyond the second semiconductor layers 130, portions of the amorphous semiconductor layer 140a on the insulating layer 120 may also extend beyond the second semiconductor layers 130.

Referring now to FIG. 2C, the amorphous semiconductor layer 140a is crystallized to form a strained first semiconductor layer 140. For example, the amorphous semiconductor layer 140a may be crystallized by annealing the amorphous semiconductor layer 140a at a temperature of about 500° C. The amorphous semiconductor layer 140a may be laterally crystallized from the second semiconductor layers 130 onto the insulating layer 120 until the crystal growth fronts coalesce on the insulating layer 120, for example, using a lateral SPE process. In some embodiments, such as where the second semiconductor layers 130 are formed thicker than the insulating layer 120, the amorphous semiconductor layer 140a may be deposited and crystallized on the insulating layer 120 and the second semiconductor layers 130, and may then be removed from upper surfaces of the second semiconductor layers 130, for example, by chemical-mechanical polishing (CMP), until the strained first semiconductor layer 140 remains on only the insulating layer 120. As such, the strained first semiconductor layer 140 may be laterally epitaxially grown from the sidewalls of the second semiconductor layers 130, and may extend onto the insulating layer 120 but not onto top surfaces of the second semiconductor layers 130.

Figure 2D:
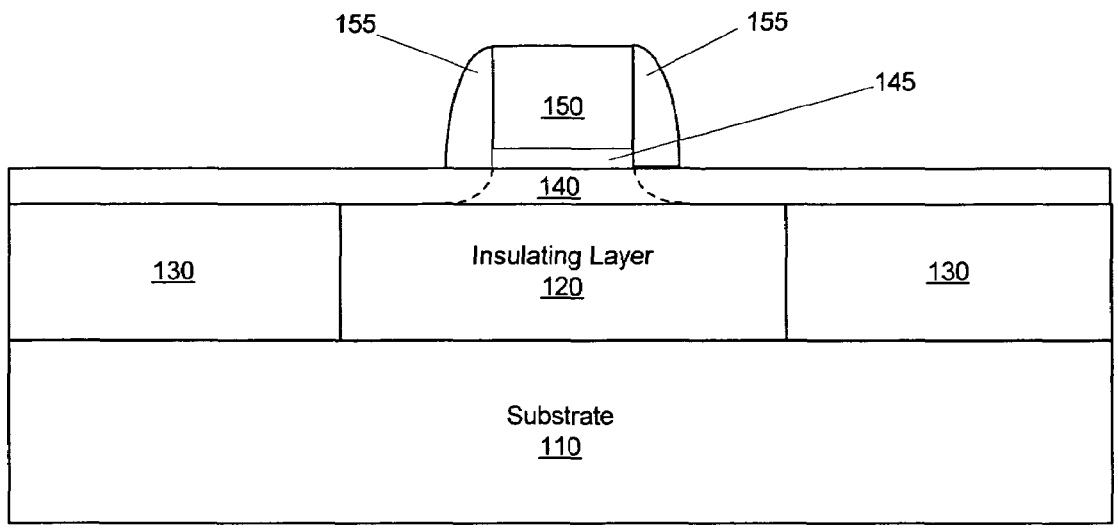

Then, as shown in FIG. 2D, a gate insulating layer 145, a gate electrode 150, and spacers 155 are formed on the strained first semiconductor layer 140. The spacers 155 are formed adjacent to the gate electrode 150 on sidewalls thereof. The gate insulating layer 145, gate electrode 150, and spacers 155 may be formed using conventional methods and need not be described further herein. Source/drain regions may then be formed in portions of the first 140 and/or second 130 semiconductor layers on either side of the gate electrode 150, as shown by the dashed lines. The source/drain regions may be formed by ion implantation, using the gate 150 and the spacers 155 as an implantation mask. As such, the source/drain regions may be self-aligned with respect to the gate electrode 150. Alternatively, the source/drain regions may be formed by dopant out-diffusion from raised source drain regions 160, which are further described below. Although not shown, source/drain contacts may be formed on a surface of the source/drain regions. For example, the source/drain contacts may be formed of nickel germanosilicide, as is well-known in the art.

Figure 2E:
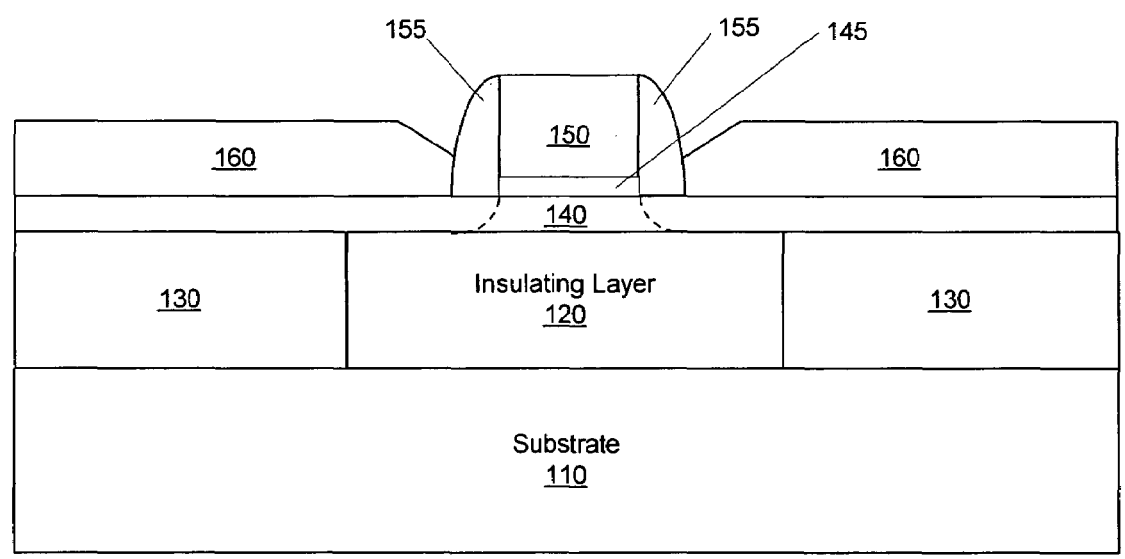

In some embodiments, as shown in FIG. 2E, raised source drain regions 160 may be formed on opposite sides of the gate electrode 150. For example, the raised source/drain regions 160 may be formed by a second selective epitaxial growth (SEG) process using in-situ doping and/or followed by an ion implantation process. As such, the raised source/drain regions 160 may also be self-aligned with respect to the gate electrode 150. Also, although not shown, source/drain contacts may be formed on surfaces of the raised source/drain regions 160. For example, source/drain contacts may be formed on a top surface and/or sidewalls of the raised source/drain regions 160, which may reduce contact resistance.

Figure 3A:
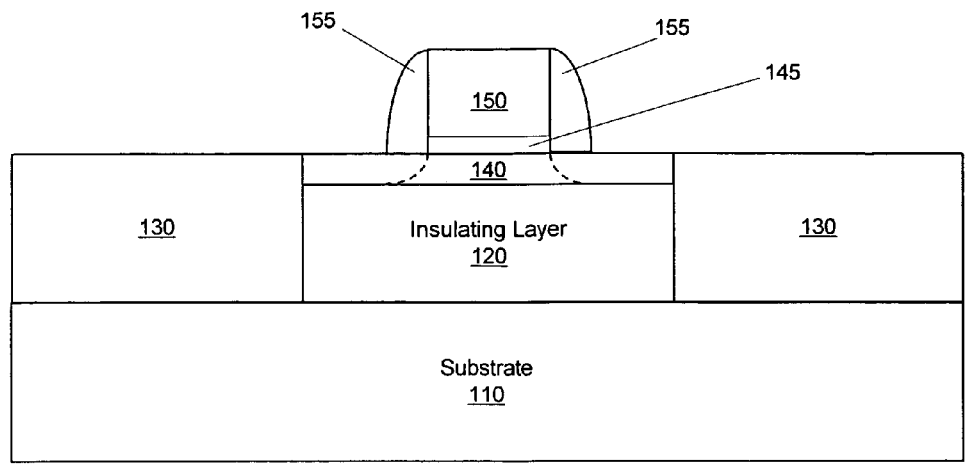
FIGS. 3A to 3C are cross-sectional views illustrating exemplary alternate strained semiconductor-on-insulator structures according to further embodiments of the present invention.
Figure 3B:
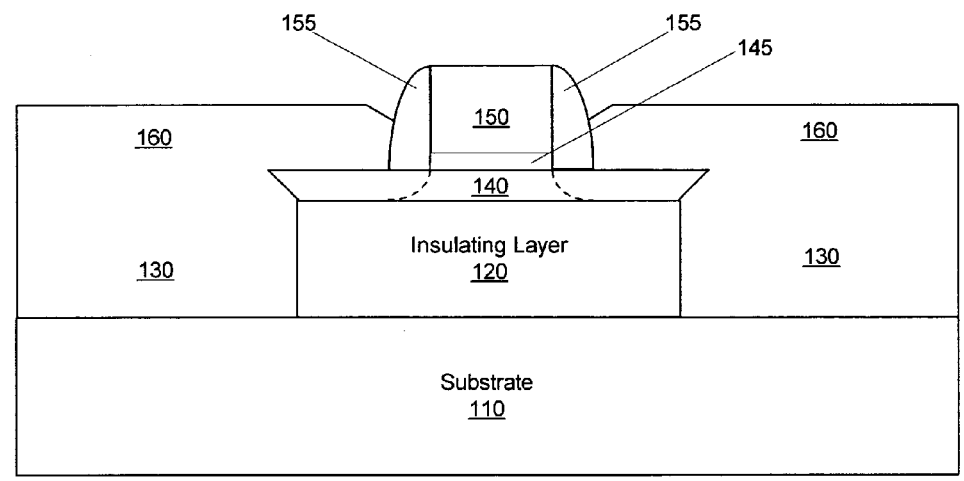
Figure 3C:
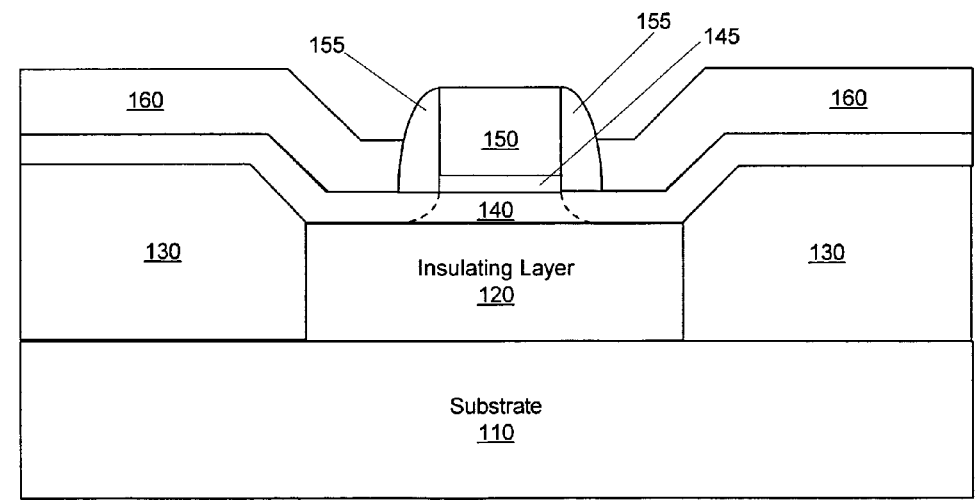

FIGS. 3A to 3C are cross-sectional views illustrating exemplary alternate strained semiconductor-on-insulator structures according to further embodiments of the present invention. In particular, FIGS. 3A to 3C illustrate alternate embodiments of the strained first insulating layer 140 of FIG. 1. Although the strained first semiconductor layer 140 is shaped differently in FIGS. 3A to 3C, it is to be understood that the semiconductor on insulator structures of FIGS. 3A to 3C may operate and/or function similarly to the semiconductor on insulator device 100 of FIG. 1.

Referring now to FIG. 3A, the second semiconductor layers 130 extend away from the substrate 110 beyond the insulating layer 120 on opposite sides thereof. For example, the insulating layer 120 may be recessed such that the second semiconductor layers 130 are thicker and/or higher than the insulating layer 120. As such, the strained first semiconductor layer 140 extends from sidewalls of the second semiconductor layers 130 onto the insulating layer 120. For example, the strained first semiconductor layer 140 may be laterally epitaxially grown from sidewalls of the second semiconductor layers 130 using a lateral solid-phase epitaxy (SPE) process. More specifically, an amorphous semiconductor layer may be deposited on the insulating layer 120 and the second semiconductor layers 130 and may be laterally crystallized from the second semiconductor layers 130 until the crystal growth fronts coalesce on the insulating layer 120 to form the strained first semiconductor layer 140. Portions of the strained first semiconductor layer 140 may then be removed from upper surfaces of the second semiconductor layers 130, for example, by chemical-mechanical polishing (CMP), until the strained first semiconductor layer 140 remains on only the insulating layer 120. Thus, the strained first semiconductor layer 140 extends directly onto the insulating layer 120, but not onto top surfaces of the second semiconductor layers 130.

FIG. 3B illustrates another strained semiconductor-on-insulator structure according to some embodiments of the present invention. As shown in FIG. 3B, the second semiconductor layers 130 are formed to a thickness and/or height greater than that of the insulating layer 120. For example, the second semiconductor layers 130 may be formed on opposite sides of the insulating layer 120 by a selective epitaxial growth (SEG) process. As in FIG. 3A, the strained first semiconductor layer 140 may also be laterally epitaxially grown from sidewalls the second semiconductor layers 130, thereby extending directly onto the insulating layer 120 but not onto top surfaces of the second semiconductor layers 130. As further illustrated in FIG. 3B, raised source/drain regions 160 extend from the second semiconductor layers 130. For example, the raised source/drain regions 160 may be formed on the second semiconductor layers 130 at opposite sides of the gate electrode 150 by a second selective epitaxial growth (SEG) process using in-situ doping and/or followed by ion implantation.

FIG. 3C illustrates still another strained semiconductor-on-insulator structure according to some embodiments of the present invention. Referring to FIG. 3C, the second semiconductor layers 130 extend beyond the insulating layer 120, and may be formed by selective epitaxial growth and/or recession of the insulating layer 120 as described above. The strained first semiconductor layer 140 extends onto both the insulating layer 120 and the second semiconductor layers 130. As such, portions of the strained first semiconductor layer 140 on the second semiconductor layers 130 extend beyond the insulating layer. For example, the strained first semiconductor layer may be formed by depositing an amorphous semiconductor layer that is conformal with the topology of the underlying insulating layer 120 and second semiconductor layers 130, and then crystallizing the amorphous semiconductor layer, as described above with reference to FIGS. 2B to 2C. The raised source/drain regions 160, which may be formed by a second selective epitaxial growth process using in-situ doping and/or followed by an ion implantation process, also conform to the shape of the underlying insulating layer 120 and second semiconductor layers 130.

Figure 4A:
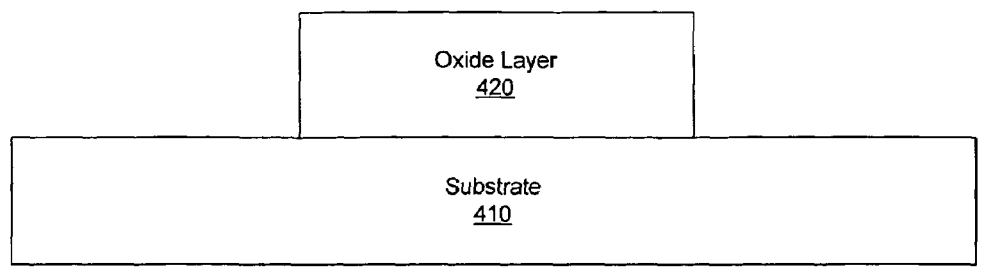
FIGS. 4A to 4D are cross-sectional views illustrating strained silicon-on-insulator devices according to exemplary embodiments of the present invention during intermediate fabrication steps according to exemplary embodiments of the present invention.
Figure 4B:
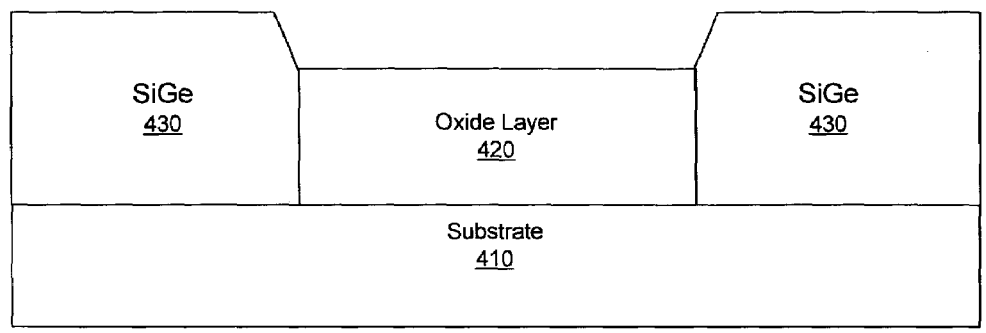

FIGS. 4A to 4D are cross-sectional views illustrating strained silicon-on-insulator devices according to exemplary embodiments of the present invention during intermediate fabrication steps according to exemplary embodiments of the present invention. Referring now to FIG. 4A, an oxide layer 420, such as silicon dioxide ($SiO_2$), is formed on a substrate 410. As shown in FIG. 4B, silicon-germanium (SiGe) layers 430 are formed on the substrate 410 adjacent the oxide layer 420 on opposite sides thereof. For example, the silicon-germanium layers 430 may be selectively grown on opposite sides of the oxide layer 420 using a selective epitaxial growth (SEG) process. In some embodiments, the SEG process may be performed at a temperature of about 500° C. and at a pressure of about 275 mTorr. The germanium concentration of the silicon germanium layers 430 may be about 51.4%. In other embodiments, the silicon germanium layers 430 may further include boron and/or carbon to at least partially compensate the strain, for example, to reduce defect density while allowing a relatively large Ge concentration to reduce the bandgap, and hence, the contact resistance. The silicon germanium layers 430 may extend beyond/be formed to a greater thickness and/or height than the oxide layer 420.

Figure 4C:
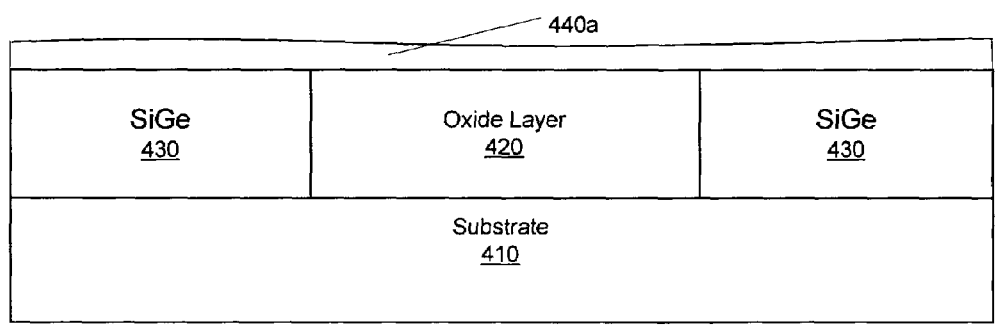
Figure 4D:
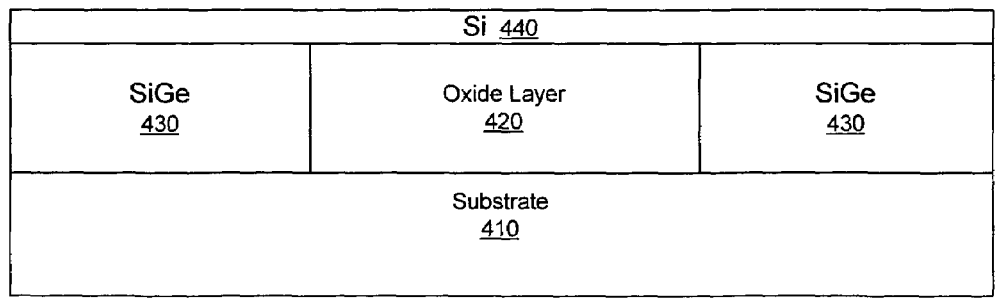

As shown in FIGS. 4C to 4D, the substrate 410 including the silicon germanium layers 430 and the oxide layer 420 thereon is planarized to recess the silicon germanium layers 430 to a height similar to that of the oxide layer 420. For example, a chemical-mechanical polishing (CMP) process may be used to planarize the substrate 410. A strained silicon layer 440 is then epitaxially grown from the silicon germanium layers 430 to extend onto the oxide layer 420 between the silicon germanium layers 430. For example, the strained silicon layer 440 may be formed using a solid-phase epitaxy (SPE) process, where the silicon germanium layers 430 serve as seed layers for the SPE.

Figure 4E:
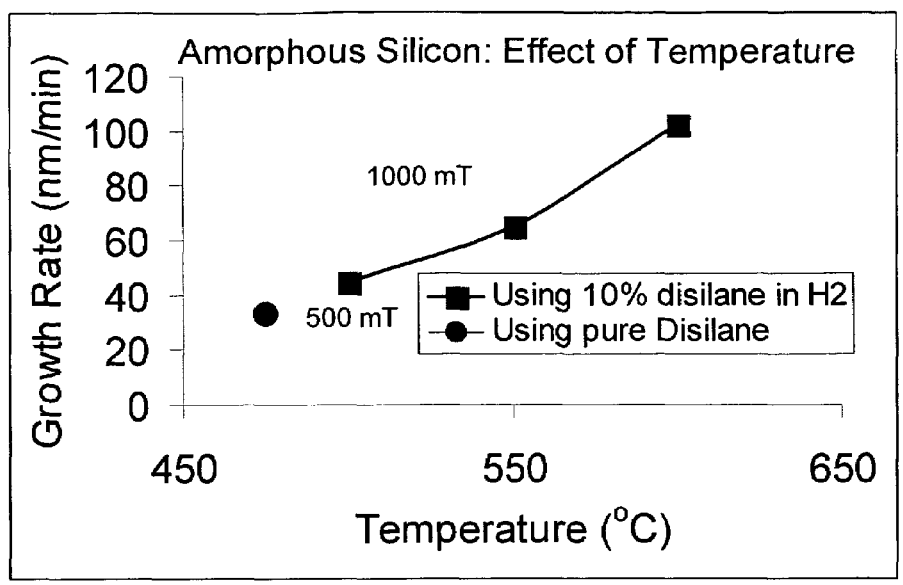
FIGS. 4E to 4G are graphs illustrating effects of temperature and pressure on amorphous silicon deposition.
Figure 4F:
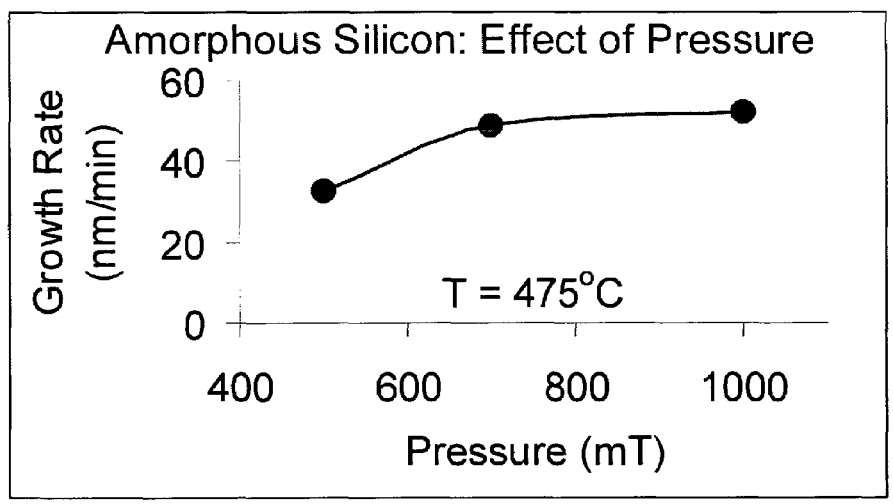
Figure 4G:
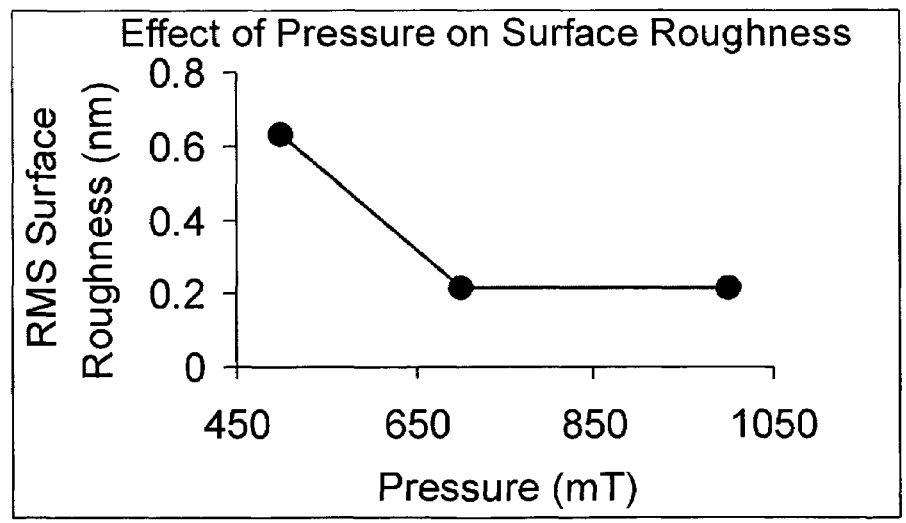

More particularly, referring to FIG. 4C, an amorphous silicon layer 440a is formed on the oxide layer 420 and the silicon germanium layers 430. The amorphous silicon layer 440a may be deposited on the oxide layer 420 and the silicon germanium layers 430, for example, using ultra-high vacuum rapid thermal chemical vapor deposition (UHV-RTCVD) and/or any other deposition techniques which may provide relatively low contamination levels of oxygen and/or carbon. The amorphous silicon layer 440a may be deposited at a temperature low enough to avoid polycrystalline nucleation on the oxide layer 420. For example, deposition may be performed at a temperature of about 475° C. and at a pressure of about 500 mTorr. In some embodiments, deposition temperature can be reduced below 475° C. by increasing pressure. Moreover, a smooth amorphous silicon layer 440a can be deposited by optimizing the deposition conditions. Effects of temperature and pressure on amorphous silicon growth rate and surface roughness are further illustrated in the graphs of FIGS. 4E to 4G.

Referring now to FIG. 4D, the amorphous silicon layer 440a is then crystallized. For example, the amorphous silicon layer 440a may be crystallized by annealing the amorphous silicon layer 440a at a temperature of about 500° C. in nitrogen ambient for about 5 hours. As the lattice constant of silicon is less than that of the underlying silicon germanium layers 430, a strained crystalline silicon layer 440 is formed on the oxide layer 420 as a result of the annealing process. The strained crystalline silicon layer 440 may be under biaxial tensile strain, which may be suitable for achieving high channel mobility in n-channel MOSFETS. Although not shown, a gate insulating layer, gate electrode, and spacers may then be formed as described above with reference to FIG. 2D. Source/drain regions may then be formed in portions of the strained silicon layer 140 and/or the silicon germanium layers 430, such as by ion implantation and/or dopant out-diffusion as described above.

In some embodiments, a planarization process may not be performed to recess the silicon germanium layers 430. As such, the silicon germanium layers 430 may extend from the substrate 410 beyond the oxide layer 420 as shown in FIG. 4B. The amorphous silicon layer 440a may then be deposited on the oxide layer 420 and the silicon germanium layers 430, and the strained silicon layer 440 may be laterally epitaxially grown from sidewalls of the silicon germanium layers 430 using a lateral SPE process. More particularly, the amorphous silicon layer 440a may be laterally crystallized from the silicon germanium layers 430 onto the oxide layer 420 until the crystal growth fronts coalesce on the oxide layer 420. The lateral SPE rate may depend on several factors, such as temperature, thickness of the amorphous silicon layer 440a, crystal growth direction, and/or film density/porosity. Portions of the strained silicon layer 440 may be under biaxial tensile strain, which may be suitable for achieving high channel mobility in n-channel MOSFETS. Raised source/drain regions may then be formed on the strained silicon layer 440, to provide a structure similar to that of FIG. 3C. Alternatively, the portions of the strained silicon layer 440 on upper surfaces of the silicon germanium layers 430 may be removed, for example, by CMP. As such, the strained silicon layer may extend onto the oxide layer 420 but not onto top surfaces of the silicon germanium layers 430. Raised source/drain regions may then be formed on the silicon germanium layers 430 to provide a structure similar to that of FIG. 3B.

Still referring to FIGS. 4A to 4D, the silicon germanium layers 430 may be formed to a thickness sufficient to be relaxed, which may induce strain in the strained silicon layer 440 formed thereon. As source/drain regions may be formed in the silicon germanium layers 430 in embodiments according to the present invention, the thickness of the silicon germanium layers 430 may be independent of the junction depth of the source/drain regions. In contrast, as described in the Intel prior art, a silicon germanium film is embedded in the source/drain regions to induce strain in the channel region. As such, the thickness of the prior art silicon germanium film may scale with the junction depth of the source/drain regions. As junction depth may become more shallow in future generations, the prior art silicon germanium film may become thin relative to that of embodiments of the present invention, and as such, may not be sufficient to induce strain in the channel region.

Figure 5A:
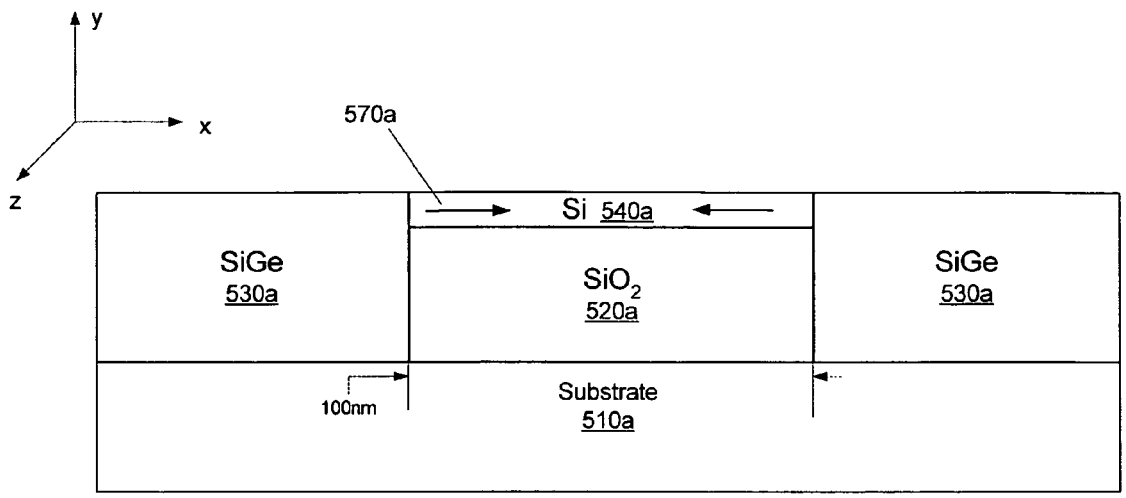
FIGS. 5A to 5C are cross-sectional views illustrating exemplary strained semiconductor-on-insulator devices according to some embodiments of the present invention.
Figure 5B:
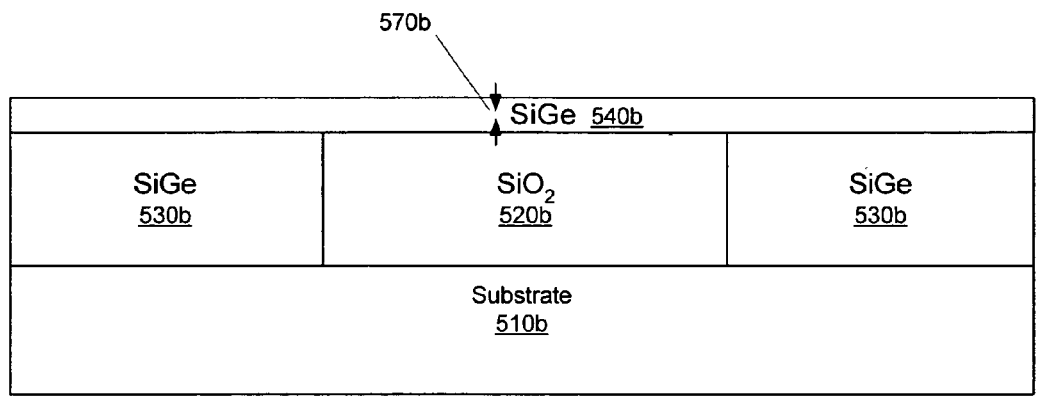
Figure 5C:
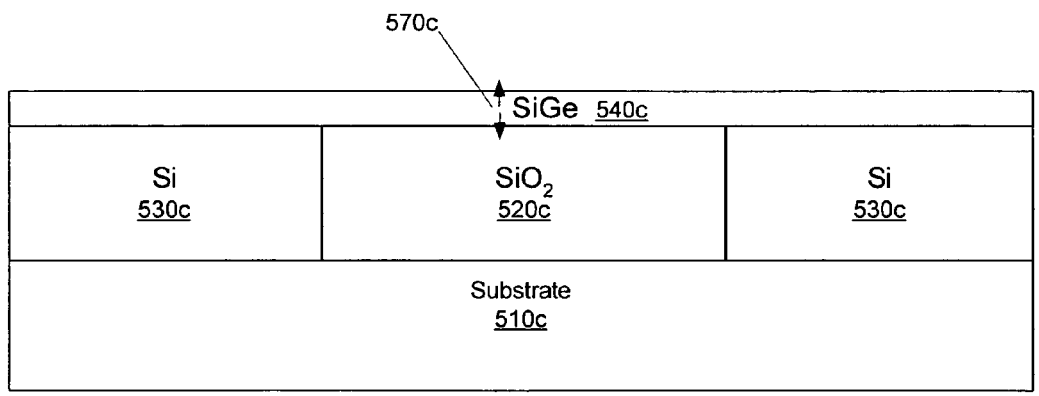

FIGS. 5A to 5C are cross-sectional views illustrating exemplary semiconductor-on-insulator devices according to some embodiments of the present invention and exemplary materials used in fabrication thereof. Referring now to FIG. 5A, the strained first semiconductor layer may be a strained silicon (Si) layer 540a, the second semiconductor layers may be silicon germanium (SiGe) seed layers 530a, and the insulating layer may be a silicon dioxide layer 520a. The strained silicon layer 540a may be epitaxially grown from the silicon germanium seed layers 530a on opposite sides of the silicon dioxide ($SiO_2$) layer 520a to extend onto the silicon dioxide layer 520a. As shown in FIG. 5A, a distance between the silicon germanium layers 530a may be less than about 100 nm. As such, the strained silicon layer 540a may be under uniaxial compressive strain along the x-direction (indicated by arrows 570a), which may be suitable for achieving high channel mobility in p-channel MOSFETS.

Figure 6A:
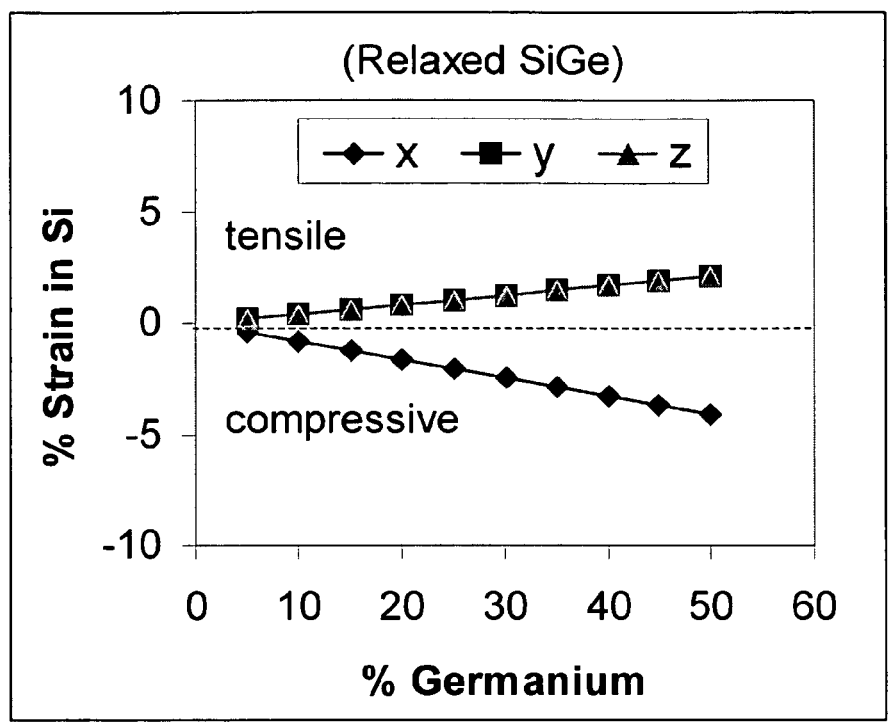
FIGS. 6A and 6B are graphs illustrating effects of germanium concentration on type and percentage of strain induced along different directions of a strained silicon layer.
Figure 6B:
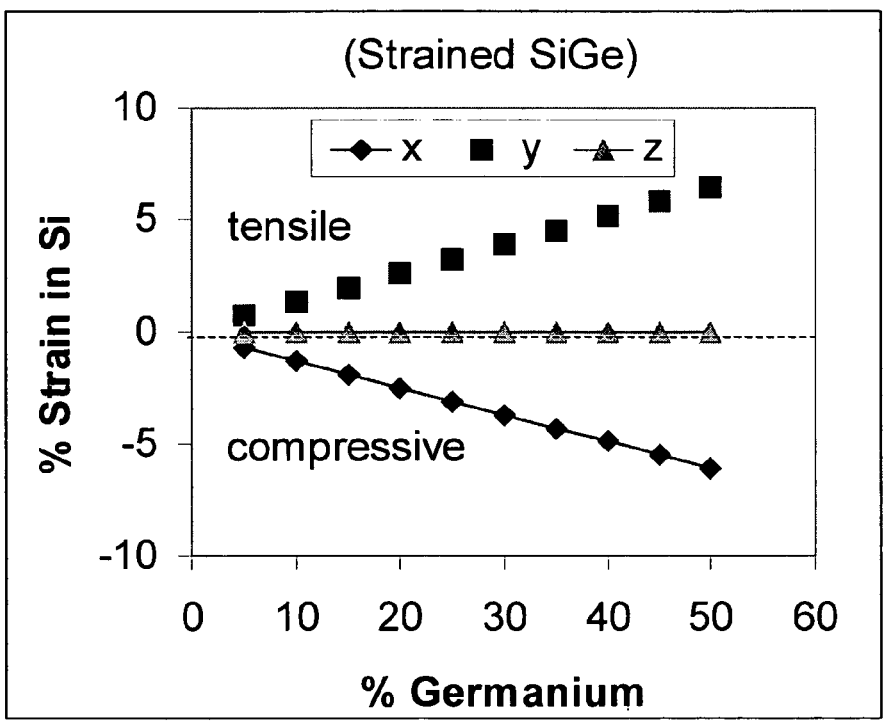

Note that the silicon germanium layers 530a may be relaxed silicon germanium layers or strained silicon germanium layers. Moreover, the type of strain that is induced in the strained silicon layer 540a may be different along different directions of the strained silicon layer 540a, as further illustrated in FIGS. 6A to 6B. For example, FIG. 6A illustrates strain along x, y, and z directions of the strained silicon layer 540a relative to the percentage of germanium in the silicon germanium layers 530a where the silicon germanium layers 530a are relaxed silicon germanium layers. As shown in FIG. 6A, when the silicon germanium layers 530a are relaxed, biaxial tensile strain is induced along the y- and z-directions of the strained silicon layer 540a, while uniaxial compressive strain is induced along the x-direction. The amount of strain increases (in all directions) as the germanium concentration of the silicon germanium layers 530a is increased. Alternatively, FIG. 6B illustrates strain along x, y, and z directions of the strained silicon layer 540a relative to the percentage of germanium in the silicon germanium layers 530a where the silicon germanium (SiGe) layers 530a are strained. As shown in FIG. 6B, when the silicon germanium layers 530a are strained, uniaxial compressive strain is induced along the x-direction of the strained silicon layer 540a, while uniaxial tensile strain is induced along the y-direction. The amount of strain increases (in the x- and y-directions) as the germanium concentration of the silicon germanium layers 530a is increased. However, the strained silicon layer 540a is unstrained along the z-direction when the silicon germanium (SiGe) layers 530a are strained. Note that, as illustrated in FIGS. 6A and 6B, the layers may be fully strained, which may require that the strain energy be below a critical energy for forming dislocations, and which may also require that the film thicknesses may be below a critical thickness for dislocation formation.

FIG. 5B illustrates an alternative embodiment, where the strained first semiconductor layer is a strained silicon germanium (SiGe) layer 540b that may be epitaxially grown from the silicon germanium (SiGe) seed layers 530b on opposite sides of the silicon dioxide (SiO$_2$) layer 520b. The germanium concentration of the strained silicon germanium layer 540b may be less than that of the silicon germanium seed layers 530b. As such, the lattice constant of the strained silicon germanium layer 540b may be less than the lattice constant of the silicon germanium layers 530b, thereby creating uniaxial compressive strain (indicated by arrows 570b) in the strained silicon germanium layer 540b. More specifically, if the lattice constant of the strained silicon germanium layer 540b is less than that of the silicon germanium seed layers 530b, portions of the strained silicon germanium layer 540b may be under biaxial tensile strain along the x- and z-directions, and under uniaxial compressive strain along the y-direction on the silicon dioxide layer 520b.

FIG. 5C illustrates another alternative embodiment, where the strained first semiconductor layer is a strained silicon germanium (SiGe) layer 540c, while the second semiconductor layers are silicon (Si) layers 530c. The strained silicon germanium layer 540c may be epitaxially grown from the silicon layers 530c on opposite sides of the silicon dioxide (SiO$_2$) layer 520c to extend onto the silicon dioxide layer 520c. As the lattice constant of silicon is less than that of silicon germanium, the strained silicon germanium layer 540c may be under uniaxial tensile strain (indicated by arrows 570c). More specifically, as the lattice constant of the strained silicon germanium layer 540c is greater than that of the silicon layers 530c, portions of the strained silicon germanium layer 540c may be under biaxial compressive strain along the x- and z-directions, and under uniaxial tensile strain along the y-direction on the silicon dioxide layer 520c.

Figure 7A:
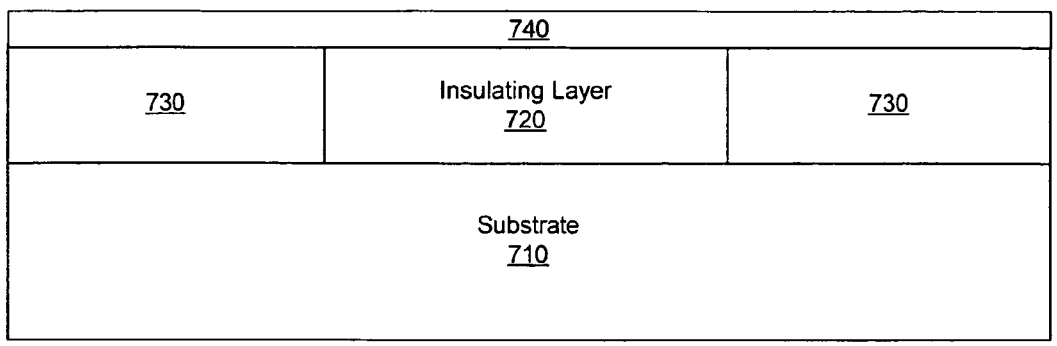
FIGS. 7A to 7C are cross-sectional views illustrating strained semiconductor-on-nothing devices according to exemplary embodiments of the present invention during intermediate fabrication steps according to exemplary embodiments of the present invention.
Figure 7B:
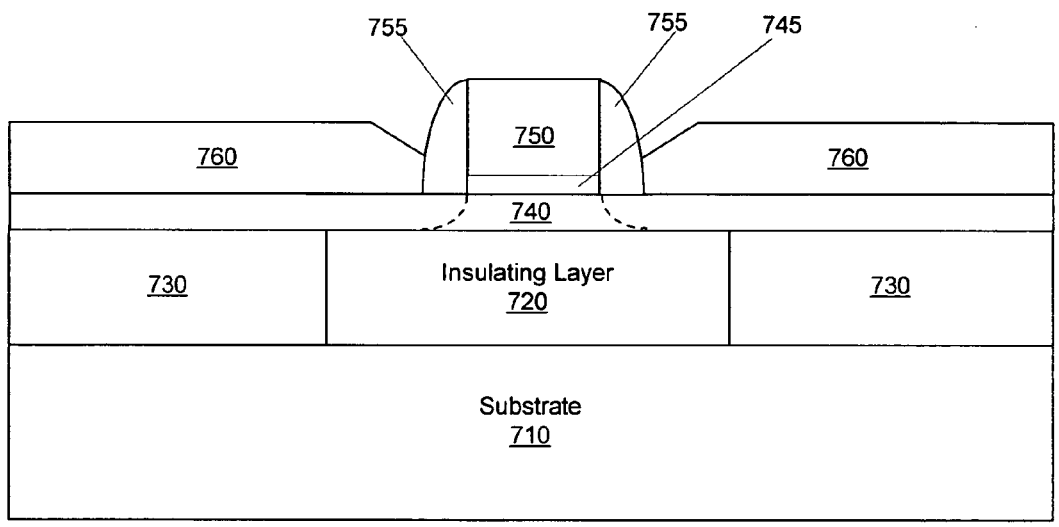
Figure 7C:
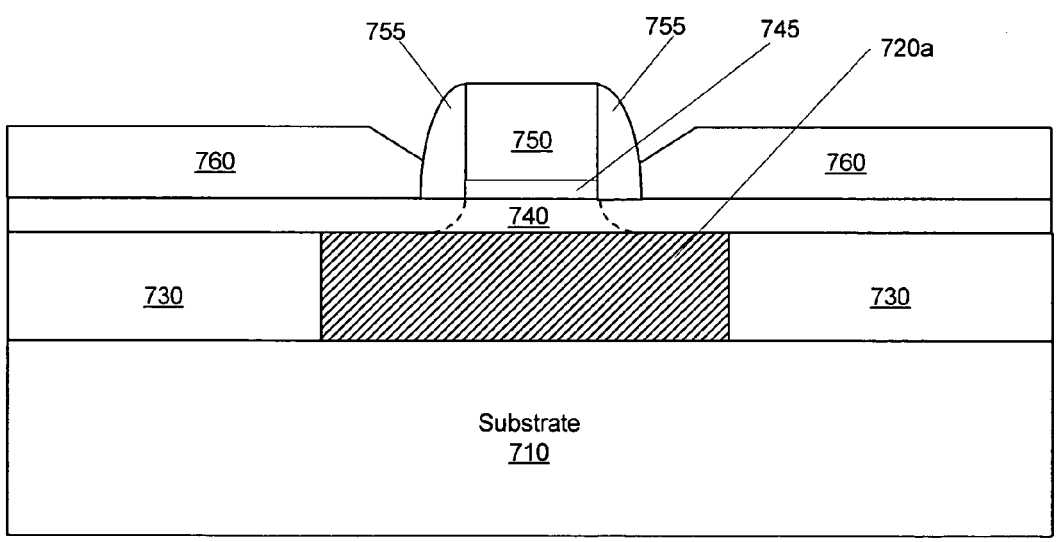

FIGS. 7A to 7C are cross-sectional views illustrating strained semiconductor-on-nothing devices according to exemplary embodiments of the present invention during intermediate fabrication steps according to exemplary embodiments of the present invention. Referring now to FIG. 7A, a strained first semiconductor layer 740 is formed on an insulating layer 720 and second semiconductor layers 730, in a manner similar to that described above. A gate insulating layer 745, gate electrode 750, spacers 755, and (optionally) raised source/drain regions 760 are then formed by conventional methods, as shown in FIG. 7B. Then, as illustrated in FIG. 7C, at least a portion of the insulating layer 720 adjacent the strained first semiconductor layer 740 is removed. For example, at least a portion of the insulating layer 720 beneath the strained first semiconductor layer 740 may be removed by selectively etching the substrate 710. Thus, an air gap 720a remains adjacent the strained first semiconductor layer 740. The air gap 720a isolates the gate electrode 750 from the substrate 710, which may provide increased immunity to short-channel effects. The gate electrode 750 may not collapse, however, because the strained first semiconductor layer 740 is supported at both ends by the second semiconductor layers 730. In some embodiments, the air gap 720a may be filled with a suitable dielectric in a subsequent step.

It should be noted that, although described above as occurring in sequence, the order of the fabrication steps of FIGS. 7A to 7C may be altered. For example, in some embodiments, the gate insulating layer 745, gate electrode 750, spacers 755, and/or raised source/drain regions 760 may be formed after removing at least a portion of the insulating layer 720. Also, although illustrated as being completely removed in the semiconductor-on-nothing device of FIG. 7C, portions of the insulating layer 720 may remain. In addition, alternate materials, such as those illustrated in FIGS. 5A to 5C, may be used to form semiconductor-on-nothing devices. For example, in the strained silicon-on-insulator device of FIG. 5A, at least a portion of the silicon dioxide layer 520a under the strained silicon layer 540a may be removed to form a strained silicon-on-nothing device. Furthermore, the alternate structures of FIGS. 3A to 3C may also be used to form semiconductor-on-nothing devices by removing the insulating layer 120 as described above.

Thus, according to embodiments of the present invention, ultra-thin strained semiconductor layers, such as strained silicon and/or germanium layers, can be grown on an insulating layer, such as an oxide layer. In addition, the insulating layer may be removed, such as by a selective etch, to form strained semiconductor-on-nothing structures. As such, fully depleted MOSFET structures with strained silicon and/or germanium on insulator channel regions and silicon-germanium source/drain regions may be formed.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and detail may be made without departing from the spirit and scope of the present invention as set forth in the following claims.

That which is claimed is:

1. A method of fabricating a semiconductor device, comprising:

forming a strained first semiconductor layer that extends from second semiconductor layers onto an insulating layer therebetween and that has a lattice constant that is different than that of the second semiconductor layers.

2. A method according to claim 1, wherein the insulating layer comprises an oxide, wherein the second semiconductor layers comprise silicon, and wherein the strained first semiconductor layer comprises silicon germanium under uniaxial tensile strain.

3. A method according to claim 1, further comprising:
removing at least a portion of the insulating layer adjacent the strained first semiconductor layer to form a semiconductor-on-nothing device.

4. A method according to claim 3, wherein removing at least a portion of the insulating layer comprises:
selectively etching the substrate to remove at least a portion of the insulating layer.

5. A method according to claim 1, further comprising:
forming source/drain regions in the first and/or second semiconductor layers; and
forming source/drain contacts electrically contacting the source/drain regions.

6. A method according to claim 5, wherein forming source/drain contacts comprises:
forming nickel germanosilicide source/drain contacts electrically contacting the source/drain regions.

7. A method of fabricating a semiconductor device, the method comprising:
forming second semiconductor layers and an insulating layer therebetween on a substrate; and
epitaxially growing a strained first semiconductor layer from the second semiconductor layers to extend onto the insulating layer between the second semiconductor layers,
wherein the second semiconductor layers have a lattice constant that is different than that of the strained first semiconductor layer.

8. A method according to claim 7, wherein forming the second semiconductor layers comprises:
selectively epitaxially growing the second semiconductor layers adjacent the insulating layer on opposite sides thereof.

9. A method according to claim 7, wherein forming on the substrate the second semiconductor layers and the insulating layer therebetween comprises:
forming the second semiconductor layers to extend away from the substrate beyond the insulating layer.

10. A method according to claim 7, wherein epitaxially growing the strained first semiconductor layer comprises:
epitaxially growing the strained first semiconductor layer from sidewalls of the second semiconductor layers to extend onto the insulating layer.

11. A method according to claim 7, wherein epitaxially growing the strained first semiconductor layer comprises:
forming an amorphous semiconductor layer on the insulating layer and on the second semiconductor layers; and then
crystallizing the amorphous semiconductor layer.

12. A method according to claim 11, wherein crystallizing the amorphous semiconductor layer comprises:
laterally crystallizing the amorphous semiconductor layer from the second semiconductor layers onto the insulating layer until crystal growth fronts thereof coalesce on the insulating layer.

13. A method according to claim 11, wherein crystallizing the amorphous semiconductor layer comprises:
annealing the amorphous semiconductor layer at a temperature of about 500° C.

14. A method according to claim 11, wherein forming an amorphous semiconductor layer comprises:
depositing the amorphous semiconductor layer using ultra-high vacuum rapid thermal chemical vapor deposition (UHV-RTCVD) at a temperature low enough to avoid nucleation on the insulating layer.

15. A method according to claim 7, wherein the insulating layer comprises an oxide, wherein the second semiconductor layers comprise silicon germanium, and wherein the strained first semiconductor layer comprises strained silicon and/or germanium.

16. A method according to claim 15, wherein the second semiconductor layers further comprise boron and/or carbon.

17. A method according to claim 15, wherein a distance between the second semiconductor layers is less than about 100 nm, and wherein the strained first semiconductor layer is under uniaxial compressive strain.

18. A method of forming a semiconductor device, comprising:
forming on a substrate an oxide layer and silicon germanium layers at opposite sides of the oxide layer; and
epitaxially growing a strained silicon layer from the silicon germanium layers to extend onto the oxide layer between the silicon germanium layers.

19. A method according to claim 18, wherein epitaxially growing the strained silicon layer comprises:
forming an amorphous silicon layer on the oxide layer and on the silicon germanium layers; and then
crystallizing the amorphous silicon layer.

20. A method according to claim 19, wherein crystallizing the amorphous silicon layer comprises:
laterally crystallizing the amorphous silicon layer from the silicon germanium layers onto the oxide layer until crystal growth fronts thereof coalesce on the oxide layer.

21. A method according to claim 19, wherein crystallizing the amorphous silicon layer comprises:
annealing the amorphous silicon layer at a temperature of about 500° C.

22. A method according to claim 19, wherein forming an amorphous silicon layer comprises:
depositing the amorphous silicon layer using ultra-high vacuum rapid thermal chemical vapor deposition (UHV-RTCVD) at a temperature low enough to avoid nucleation on the oxide layer.

23. A method according to claim 18, wherein forming the silicon germanium layers comprises:
selectively epitaxially growing the silicon-germanium layers adjacent the oxide layer on opposite sides thereof.

24. A method according to claim 18, wherein epitaxially growing the strained silicon layer comprises:
epitaxially growing the strained silicon layer from sidewalls of the silicon germanium layers to extend onto the oxide layer.

25. A method according to claim 18, wherein the silicon germanium layers further comprise boron and/or carbon.

26. A method according to claim 18, wherein a distance between the silicon germanium layers is less than about 100 nm, and wherein the strained silicon layer is under uniaxial compressive strain.

27. A method according to claim 18, further comprising:
removing at least a portion of the oxide layer adjacent the strained silicon layer to form a silicon-on-nothing device.

28. A semiconductor device, comprising:
a substrate;
an insulating layer on the substrate;
second semiconductor layers on the substrate adjacent the insulating layer at opposite sides thereof; and
a strained first semiconductor layer that extends from the second semiconductor layers onto the insulating layer and that has a lattice constant that is different than that of the second semiconductor layers.

29. A device according to claim 28, wherein the strained first semiconductor layer comprises:
   a strained semiconductor epitaxial layer that extends from the second semiconductor layers onto the insulating layer.

30. A device according to claim 29, wherein the strained semiconductor epitaxial layer has a lattice constant that is less than that of the second semiconductor layers.

31. A device according to claim 29, wherein the strained semiconductor epitaxial layer extends from sidewalls of the second semiconductor layers onto the insulating layer.

32. A device according to claim 28, wherein the second semiconductor layers comprise second semiconductor epitaxial layers.

33. A device according to claim 28, wherein the second semiconductor layers extend away from the substrate beyond the insulating layer.

34. A device according to claim 28, wherein the insulating layer comprises an oxide, wherein the second semiconductor layers comprise silicon germanium, and wherein the strained first semiconductor layer comprises strained silicon and/or germanium.

35. A device according to claim 34, wherein the second semiconductor layers further comprise boron and/or carbon.

36. A device according to claim 34, wherein a distance between the second semiconductor layers is less than about 100 nm, and wherein the strained first semiconductor layer is under uniaxial compressive strain.

37. A device according to claim 28, wherein the insulating layer comprises an oxide, wherein the second semiconductor layers comprise silicon, and wherein the strained first semiconductor layer comprises silicon germanium under uniaxial tensile strain.

38. A device according to claim 28, wherein at least a portion of the strained first semiconductor layer comprises a channel region of a field-effect transistor device, and further comprising:
   source/drain regions in the first and/or second semiconductor layers; and
   source/drain contacts electrically contacting the source/drain regions.

39. A device according to claim 38, wherein the source/drain contacts comprise nickel germanosilicide.

* * * * *